(12) United States Patent
Staudinger et al.

(10) Patent No.: US 11,756,788 B2
(45) Date of Patent: Sep. 12, 2023

(54) METHOD FOR GROWING A METASTABLE CRYSTALLINE STRUCTURE WHICH IS A 2-DIMENSIONAL PLANAR FILM FROM A NANOWIRE METASTABLE SEED CRYSTAL PROVIDED INSIDE A TEMPLATE STRUCTURE

(71) Applicant: International Business Machines Corporation, Armonk, NY (US)

(72) Inventors: Philipp Staudinger, Horgen (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 16/926,850

(22) Filed: Jul. 13, 2020

(65) Prior Publication Data
US 2022/0013355 A1    Jan. 13, 2022

(51) Int. Cl.
*C30B 25/04*     (2006.01)
*H01L 21/02*     (2006.01)
(Continued)

(52) U.S. Cl.
CPC ........ *H01L 21/02645* (2013.01); *C30B 25/02* (2013.01); *C30B 25/04* (2013.01);
(Continued)

(58) Field of Classification Search
CPC ......... C30B 25/00; C30B 25/02; C30B 25/04; C30B 25/16; C30B 25/18; C30B 25/183;
(Continued)

(56) References Cited

U.S. PATENT DOCUMENTS

2009/0278125 A1* 11/2009 Duan .................. B82Y 10/00
438/488
2016/0351391 A1* 12/2016 Borg ................. H01L 21/02639
(Continued)

FOREIGN PATENT DOCUMENTS

KR     102029180 B1    10/2019

OTHER PUBLICATIONS

Jacobsson, et al. publication entitled "Phase transformation in radially merged wurtzite GaAs nanowires," Crystal Growth and Design, vol. 15, pp. 4795-4803 (2015). (Year: 2015).*
(Continued)

*Primary Examiner* — Kenneth A Bratland, Jr.
(74) *Attorney, Agent, or Firm* — Jeffrey M. Ingalls

(57) ABSTRACT

A method for fabricating a metastable crystalline structure is provided. The method includes providing a base substrate, wherein the base substrate comprises an insulating layer. The method further includes providing a metastable seed crystal on the base substrate, wherein the metastable seed crystal has a predefined metastable crystal phase or a predefined metastable composition. The method further includes forming a template structure above the base substrate, wherein the template structure covers at least a part of the metastable seed crystal. The method further includes growing the metastable crystalline structure with the predefined metastable crystal phase or the predefined metastable composition of the seed crystal inside the template structure. The growing of the metastable crystalline structure is nucleated from the seed crystal. Crystalline structures produced by the methods described herein are also provided.

14 Claims, 5 Drawing Sheets

(51) Int. Cl.
   *H01L 29/04* (2006.01)
   *H01L 29/20* (2006.01)
   *H01L 29/161* (2006.01)
   *H01L 29/16* (2006.01)
   *C30B 25/02* (2006.01)
   *C30B 29/48* (2006.01)
   *C30B 29/36* (2006.01)
   *C30B 29/40* (2006.01)

(52) U.S. Cl.
   CPC ........ *C30B 29/48* (2013.01); *H01L 21/02647* (2013.01); *H01L 29/04* (2013.01); *H01L 29/161* (2013.01); *H01L 29/1608* (2013.01); *H01L 29/20* (2013.01); *H01L 29/2003* (2013.01); *C30B 29/36* (2013.01); *C30B 29/40* (2013.01)

(58) Field of Classification Search
   CPC ....... C30B 25/186; C30B 29/00; C30B 29/36; C30B 29/40; C30B 29/46; C30B 29/48; H01L 21/02645; H01L 21/02647; H01L 29/04; H01L 29/1608; H01L 29/161; H01L 29/20; H01L 29/2003
   USPC ............ 117/84, 87–90, 93–95, 97, 101–102, 117/105–106, 921–923, 937, 953–955
   See application file for complete search history.

(56) References Cited

U.S. PATENT DOCUMENTS

2017/0263447 A1  9/2017  Loh et al.
2019/0228842 A1  7/2019  Jena et al.

OTHER PUBLICATIONS

Cartoixà et al. "Optical Emission in Hexagonal SiGe Nanowires", Nano Letters, Published: Jun. 27, 2017, © 2017 American Chemical Society, 6 pages.

Gagliano et al., "Efficient Green Emission from Wurtzite AlxIn1-xP Nanowires" Nano Letters, published Apr. 2018, © 2018 American Chemical Society, 7 pages.

Hauge et al., "Single-Crystalline Hexagonal Silicon-Germanium", Nano Letters, Published: Dec. 21, 2016, © 2016 American Chemical Society, 6 pages.

Jacobsson et al., "Phase Transformation in Radially Merged Wurtzite GaAs Nanowires" Crystal Growing and Design, published Aug. 2015, © 2015 American Chemical Society, 9 pages.

Staudinger et al., "Concurrent Zinc-Blende and Wurtzite Film Formation by Selection of Confined Growth Planes", Nano Letters, 2018, published Nov. 2018, © 2018 American Chemical Society, 7 pages.

* cited by examiner

101

102

103

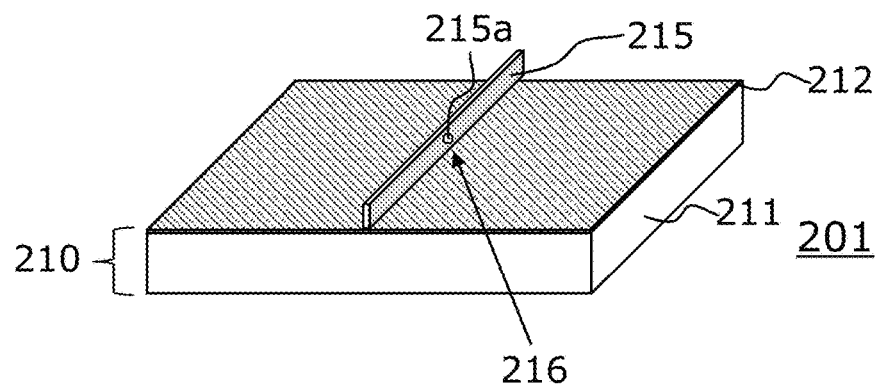
FIG. 2a
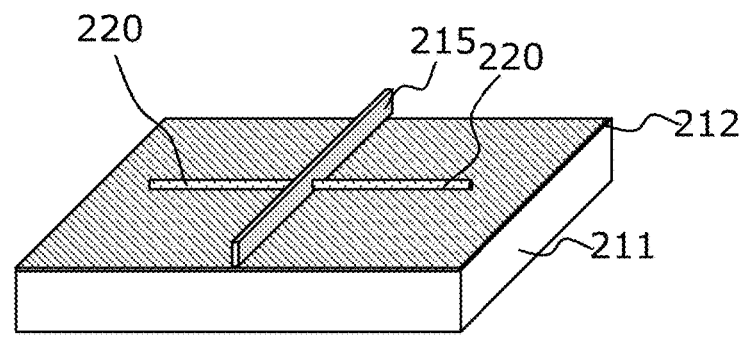
FIG. 2b
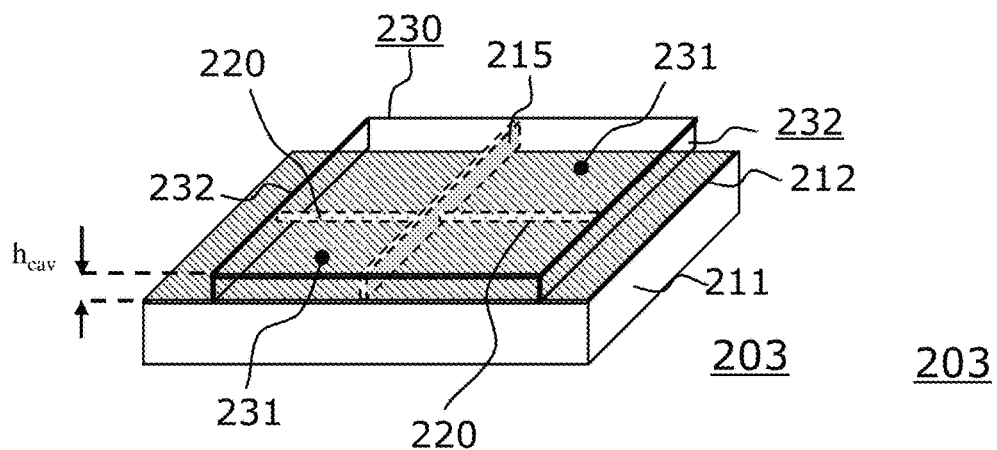
FIG. 2c
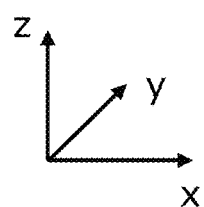

204

205

206

METHOD FOR GROWING A METASTABLE CRYSTALLINE STRUCTURE WHICH IS A 2-DIMENSIONAL PLANAR FILM FROM A NANOWIRE METASTABLE SEED CRYSTAL PROVIDED INSIDE A TEMPLATE STRUCTURE

BACKGROUND

Embodiments relate generally to the fabrication of metastable crystalline structures.

Metastable phases of III-V materials and other materials are of high interest due to their unique properties. Even though research has intensified in recent years, synthesizing these materials in their thermodynamically less stable phase remains challenging. So far many of them are only available in the form of thin nanowires, which limits optical device integration.

It is therefore desirable to provide improved fabrication methods for metastable crystalline structures.

SUMMARY

Embodiments of present disclosure are directed a method for fabricating a metastable crystalline structure. The method includes providing a base substrate, wherein the base substrate comprises an insulating layer. The method further comprises providing a metastable seed crystal on the base substrate, wherein the metastable seed crystal has a predefined metastable crystal phase or a predefined metastable composition. The method further includes a step of forming a template structure above the base substrate, wherein the template structure covers at least a part of the metastable seed crystal. The method further includes a step of growing the metastable crystalline structure with the predefined metastable crystal phase or the predefined metastable composition of the seed crystal inside the template structure. The growing of the metastable crystalline structure is nucleated from the seed crystal.

In other embodiments, a crystalline structure is provided. The crystalline structure includes a base substrate, an insulating layer on the base substrate and an elongated metastable seed crystal which extends in a first lateral direction of the base substrate. The elongated metastable seed crystal has a predefined metastable crystal phase or a predefined metastable composition. The crystalline structure further comprises a metastable crystalline structure which is nucleated from the elongated seed crystal and which is grown as a planar film in a second lateral direction of the base substrate with the predefined metastable crystal phase or the predefined metastable composition of the seed crystal.

A further embodiment relates to an electronic device including a metastable crystalline structure. The metastable crystalline structure includes a base substrate, an insulating layer on the base substrate, an elongated metastable seed crystal extending in a first lateral direction of the base substrate, the elongated metastable seed crystal having a predefined metastable crystal phase or a predefined metastable composition, and a metastable crystalline structure being nucleated from the elongated seed crystal and being grown as a planar film in a second lateral direction of the base substrate with the predefined metastable crystal phase or the predefined metastable composition of the seed crystal. If not indicated otherwise, the steps of the different aspects of the embodiments may be performed in different orders. Furthermore, the steps may also be combined such that two or more steps may be performed together.

Advantages of the features of one aspect of the embodiments may apply to corresponding features of another aspect of the embodiments.

Embodiments will be described in more detail below, by way of illustrative and non-limiting examples, with reference to the accompanying drawings.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIG. 2a illustrates a 3-dimensional view of an initial structure with a semiconductor fin;

FIG. 2b illustrates a 3-dimensional view of a structure after a metastable seed crystal has been grown directly on the base substrate;

FIG. 2c illustrates a 3-dimensional view of a structure after a template structure has been formed above the base substrate;

FIG. 4b shows an exemplary cross-sectional view taken along the line A-A of FIG. 4a.

Figure 1A:
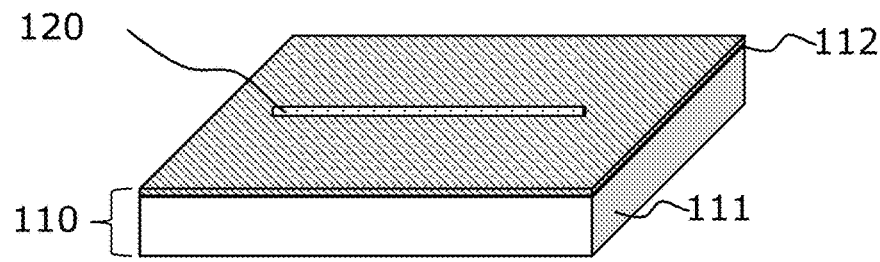
FIG. 1a shows a structure comprising a base substrate and a metastable seed crystal.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

Various embodiments of the present disclosure are described herein with reference to the related drawings.

Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, certain embodiments provide a fabrication method for fabricating metastable crystalline structures. Methods according to certain embodiments may facilitate in particular the fabrication of thin films (i.e., planar layers of metastable crystalline structures). Such films, which may also be denoted as 2-dimensional films, may facilitate the use of metastable crystalline structures for optical device integration, solid state lighting applications as well as applications on the CMOS chip market. Methods according to certain embodiments perform a controlled growth of the 2D film from a crystal 1D seed wire of a metastable crystalline phase by vertical confinement, whereby the orientation of the confinement may be in particular chosen such that the formation of unstable crystalline facets is prevented.

According to embodiments, the term metastable is used in this context to describe a state of a crystal that is different from its ground state, but that remains stable under ambient conditions.

The term metastable may refer in particular to the crystal phase or the composition of a crystalline structure.

Examples of metastable crystalline structures include diamond (graphite is the thermodynamically stable crystal phase), the zinc-blende phase of III-nitrides or the wurtzite phase of other group III-V materials.

Examples of metastable compositions of a crystalline structure include binary and ternary alloys which according to their temperature dependent phase diagram exist in various stoichiometric bonding configurations. Hence according to embodiments, a crystalline structure with a metastable composition may be in particular a crystalline structure with a metastable stoichiometry.

The term unstable crystalline facet describes a crystalline surface structure with a specific unit cell which is prone to switch into an energetically lower energy state during epitaxial growth.

The terms "lateral" or "laterally" are used in this context, as is customary, to indicate orientation generally parallel to the plane of a substrate, as opposed to generally vertically, or outwardly, from the substrate surface.

Figure 1B:
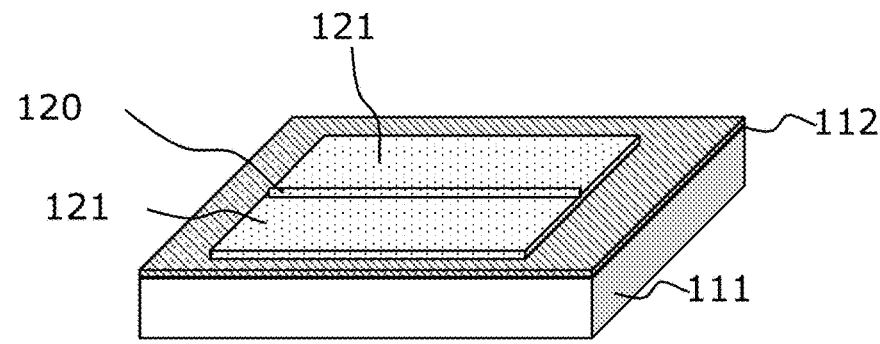
FIG. 1b shows a structure after a metastable crystalline structure has been grown with the same predefined metastable crystal phase as the seed crystal.
Figure 1C:
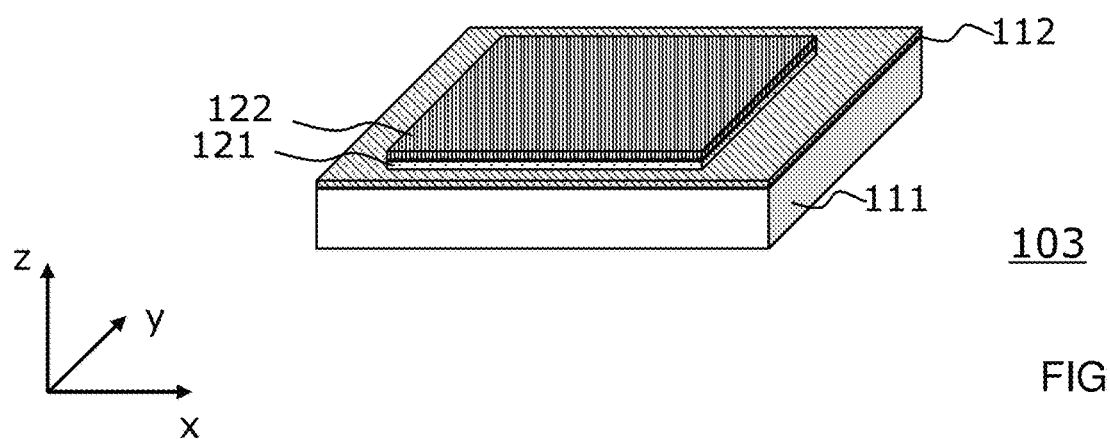
FIG. 1c shows a structure after a further metastable crystalline structure has been formed on the crystalline structure of FIG. 1b.

Referring now to the drawings in which like numerals represent the same or similar elements and initially to FIGS. 1a to 1c, these figures show 3-dimensional views of selected fabrication steps of a method according to certain embodiments.

FIG. 1a shows a structure 101 comprising a base substrate 110. The base substrate 110 comprises a base layer 111 and an insulating layer 112. The insulating layer 112 is illustrated with a diagonal pattern. A metastable seed crystal 120 is arranged on the insulating layer 112. The metastable seed crystal 120 has a predefined metastable crystal phase.

According to other embodiments, the metastable seed crystal 120 may have a predefined metastable composition/ stoichiometry. For the following description it is assumed that the metastable seed crystal 120 has a predefined metastable crystal phase.

According to an embodiment, the metastable seed crystal 120 may be at first pre-fabricated, e.g. by vertically growing a plurality of metastable seed crystals on a substrate, e.g. by selective area growth (SAE) or by vapor-liquid-solid (VLS)- methods. Then, in a further step the pre-fabricated metastable seed crystal 120 may be drop-casted on the base substrate 110.

FIG. 1b shows a structure 102 after a metastable crystalline structure 121 has been grown with the same predefined metastable crystal phase as the seed crystal 120. The growing has been performed inside a template structure which is not shown in FIGS. 1a to 1c and will be explained in more detail further below. The growth of the metastable crystalline structure 121 is nucleated from the seed crystal 120 and by confining the growth by the template structure the metastable crystal phase of the seed crystal 120 is transferred to the metastable crystalline structure 121. The seed crystal 120 and the metastable crystalline structure 121 are illustrated by a dotted pattern.

According to embodiments, the metastable seed crystal 120 may be a semiconductor. According to embodiments, the metastable crystalline structure 121 and the metastable seed crystal 120 may consist of or comprise the same material. According to embodiments, the metastable seed crystal 120 and the metastable crystalline structure 121 comprises a group III-V compound material or a group II-VI compound material. According to yet other embodiments, the metastable seed crystal 120 and the metastable crystalline structure 121 may comprise or consist of Weyl-semi-metals.

The predefined crystal phase of the metastable seed crystal 120 and the metastable crystalline structure 121 may be in particular the wurtzite phase, the zinc blende phase or the lonsdaleite phase. According to embodiments, the metastable seed crystal 120 and the metastable crystalline structure 121 may comprise or consist of InAlGaP in wurtzite phase. Such materials have a direct bandgap in the green wavelength regime and are hence particularly suitable for solid state lighting applications such as LEDs and lasers.

According to embodiments, the metastable seed crystal 120 and the metastable crystalline structure 121 may comprise or consist of SiGe in londsdaleite phase. SiGe has a direct bandgap in the londsdaleite phase and is in particular suitable for CMOS compatible light detectors and light sources.

FIG. 1c shows a structure 103 after a further metastable crystalline structure 122 has been formed on the crystalline structure 121 by planar epitaxy.

FIGS. 2a-2f shows successive stages of a method for fabricating a metastable crystalline structure in more detail. FIGS. 2a-2f generally show enlarged 3-dimensional views of initial, intermediate and final structures formed during the stages of the method. In any or all of the figures the dimensions may not be drawn to scale and may be shown in a simplified and schematic way to illustrate the features and principles of embodiments of the invention.

FIG. 2a illustrates a 3-dimensional view of an initial structure 201. The initial structure 200 comprises a base substrate 210. The base substrate 210 comprises a base layer 211 and an insulating layer 212. The base layer 211 of the base substrate 210 comprises a semiconductor material. The base substrate 210 may be in particular embodied as a crystalline semiconductor wafer of a large diameter. The base substrate may comprise in particular a material from group IV of the periodic table as semiconductor material. Materials of group IV include, for example, silicon, germanium, mixed silicon and germanium, mixed silicon and carbon, mixed silicon germanium and carbon and the like.

For example, the base substrate 210 may be a crystalline silicon wafer that is used in the semiconductor industry.

The insulating layer 212 may be embodied, for example, as a dielectric layer. The insulating layer 212 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof.

The thicknesses of the base layer 211 and the insulating layer 212 can be any suitable thicknesses.

The initial structure 200 comprises a semiconductor fin 215, e.g. a Silicon fin. The semiconductor fin 215 may have been formed, for example, by lithography and subsequent wet or dry etching techniques (e.g., by etching the top Silicon-Layer of an SOI-wafer). The semiconductor fin 215 has an elongated shape or, in other words, a linear shape.

The semiconductor fin 215 may further comprise on one or both lateral sides a catalytic droplet 216, e.g. a gold-silicon (Au—Si) droplet. The droplet 216 will serve as catalysator for the subsequent growth of a metastable seed crystal from a semiconductor seed surface 215a which is covered by the droplet 216.

FIG. 2b illustrates a 3-dimensional view of a structure 201 after a metastable seed crystal 220 has been grown directly on the base substrate 210 from the seed surface 215a of the semiconductor fin 215 in a first lateral direction, namely the x-direction. The growing of the metastable seed crystal 220 may be performed according to this exemplary embodiment by the vapor-liquid-solid (VLS)-method. Such a method allows the growth of 1-dimensional structures such as nanowires by chemical vapor deposition, as is well known.

First, a droplet of Au is deposited on the surface of the semiconductor fin 215, e.g. by evaporation, followed by a lift-off step, The structure 201 may then be annealed at temperatures higher than the Au—Si eutectic point, creating Au—Si alloy droplets 216 on the surface of the semiconductor fin 215. Such a mixing of Au with Si reduces the melting temperature of the alloy.

According to embodiments, lithography techniques may be used to form the diameter and position of the droplets 216. Then the reaction gases comprising the material of the seed crystal 220 that shall be grown are applied and the reaction gases diffuse into the droplet 216. The Au-alloy of the droplet 216 facilitates a rapid adsorption of the vapor and the seed crystal 220 nucleates at the interface of the liquid droplet 216 and the solid semiconductor fin 215. This results in a lateral growth of the seed crystal 220 parallel to the surface of the insulating layer 212. The growth of the seed crystal 220 is controlled in such a way that the seed crystal 220 has a predefined metastable crystal phase. The metastable seed crystal 220 is embodied as elongated seed crystal having an elongated shape and it may be in particular embodied as a nanowire. Such an elongated seed crystal or nanowire facilitates the formation of a seed crystal with a metastable crystal phase. There are several parameters known that can be used to control the crystal phase (e.g., dopant addition, a restricted choice of nanowire diameter as well as tailoring the temperature as well as the III-V ratio as growth parameters).

In the example of FIG. 2b two metastable seed crystals 220 have been grown in opposite directions from the semiconductor fin 215.

According to another embodiment, the metastable seed crystal 220 may also be fabricated by selective area growth (SAE). According to such an embodiment, the semiconductor fin may be at first covered with an insulating layer, thereby forming an insulating mask. Then, e.g. by lithography and etching, seed windows or seed holes may be formed in the insulating mask which expose the underlying Si of the semiconductor fin 215. Furthermore, semiconductor growth conditions are selected to ensure epitaxial growth on the exposed substrate, but not on the dielectric mask.

FIG. 2c illustrates a 3-dimensional view of a structure 203 after a template structure 230 has been formed above the base substrate 210. The template structure 230 covers at least a part, in this example the whole metastable seed crystal 220. The template structure comprises a planar cavity 231. The planar cavity may also be denoted as 2-dimensional cavity. According to embodiments the planar cavity has height $h_{cav}$ of less than 200 nm, in particular less than 100 nm.

The template structure 230 may be formed, for example, by first forming a sacrificial structure (not shown) on the metastable seed crystal 220 and on the insulating layer 212. The dimensions of the sacrificial structure correspond to the dimensions of the planar cavity 231 which shall be formed. Then a cavity layer 232 is formed on the sacrificial structure. The cavity layer establishes the walls of the template structure. Then an opening may be formed in the cavity layer 231, thereby exposing a surface of the sacrificial structure. Finally, the sacrificial structure may be selectively removed. This forms the planar cavity 231 confined by the cavity layer 232 and exposes the metastable seed crystal 220.

The sacrificial structure may comprise a sacrificial material. The sacrificial structure establishes a negative mold for the planar cavity 231 to be formed subsequently. According to some embodiments, the sacrificial structure may comprise amorphous silicon as sacrificial material. This enables the use a plurality of well-known and established fabrication processes and methods to form the sacrificial structure. The sacrificial structure may be deposited in a technology that is particularly suitable for the respective sacrificial material and may have any desired form and shape. Fabrication processes such as lithography and etching processes may be adapted and optimized for the respective sacrificial material.

The cavity layer 232 is typically an insulating layer (e.g., an oxide such as silicon oxide or silicon nitride), but it might also be a layer of carbon or of other materials that suppress deposition of the semiconductor during a subsequent selective growth in the planar cavity 231. According to an embodiment, the cavity layer 232 may be formed, for example, as a blanket oxide layer using conformal deposition techniques mentioned above.

According to embodiments, the material of the cavity layer 232 is selected to have a low sticking coefficient, and hence low nucleation probability, for the semiconductor material to be grown in the cavity structure.

The selective removal of the sacrificial structure cavity may be performed by selective etching techniques. The suitable etching technique may depend on the material used as sacrificial material. There are, for example, etching techniques available that selectively remove amorphous silicon as sacrificial material. According to a preferred embodiment, the sacrificial material may be Si and the selective etching may be performed by dry etching with, for example, xenon difluoride ($XeF_2$) or wet etching with, for example, TMAH.

In general, the etching technique is chosen to be such that it only etches the sacrificial material of the sacrificial structure, but not the material of the cavity layer 232 and the material of the insulating layer 212 or the seed crystal 220.

Figure 2D:
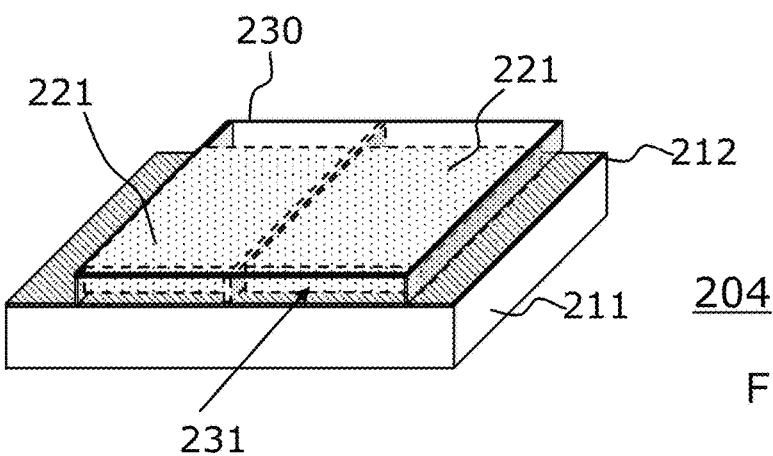
FIG. 2d illustrates a 3-dimensional view of a structure after a metastable crystalline structure has been formed in the template structure.

FIG. 2d illustrates a 3-dimensional view of a structure 204 after a metastable crystalline structure 221 has been formed in the planar cavity 231. The metastable crystalline structure 221 has the same metastable crystal phase as the seed crystal 220. The growth of the metastable crystalline structure 221 is nucleated from the seed crystal 220 and is performed in a second lateral direction. In this example, the second lateral direction is in the y-direction. The growth of the metastable crystalline structure 221 is confined by the inner dimensions of the planar cavity 231 and hence the planar cavity 231 establishes a confinement cavity for the growth of the of the metastable crystalline structure 221, and therefore may also be denoted as confinement cavity 231. The confinement cavity 231 confines the growth of the of the metastable crystalline structure to crystallographic directions that prevent a change of the predefined metastable crystal phase of the seed crystal 220. As a result, methods according to embodiments may transfer the predefined metastable crystal phase of the seed crystal 220 to the metastable crystalline structure 221.

Embodiments utilize a phenomenon that phase changes in crystals are physically only possible along certain crystallographic orientations (e.g., along (111) in ZB or (0001) in WZ). By confining the growth of the metastable crystalline structure 221 to a lateral expansion and away from (111) in ZB or (0001) in WZ direction a phase change of the metastable crystalline structure 221 can be avoided. More particularly, by growing along a lateral direction, and at the same time keeping the volume of the metastable crystalline structure 221 small by the vertical confinement, thin planar films (or planar layers of metastable materials) can be obtained. Hence the metastable crystalline structure 221 may be a planar film 221.

In certain examples, the planar cavity 231 and the corresponding planar film 221/metastable crystalline structure 221 have a height $h_{cav}$ and $h_{MCS}$ respectively of less than 200 nm. In other examples, the planar cavity 231 and the corresponding planar film 221/metastable crystalline structure 221 have a height of less than 100 nm. The planar film 221 forms a 2-dimensional metastable crystalline structure.

According to embodiments, the growing of the metastable crystalline structure 221 may be performed in particular by selective epitaxy in any suitable deposition system. For example, metal organic chemical vapor deposition (MOCVD), atmospheric pressure CVD, low or reduced pressure CVD, ultra-high vacuum CVD, chemical vapor transport (CVT), or molecular beam epitaxy (MBE) can be employed.

According to certain embodiments, the materials of the metastable crystalline structure 221 can be any material of crystalline form, but preferably group III-V compound semiconductor material. The group III-V compound semiconductor material could be a binary material such, as for example, Gallium Arsenide (GaAs) or Gallium Nitride (GaN). The group III-V material could also be a tertiary material such as, for example, Indium Gallium Arsenide (InGaAs) or Indium Gallium Nitride (InGaN). According to other embodiments group II-VI semiconductor compounds, mixed II-VI compounds, and IV-VI compounds may be used. According to another embodiment $In_xGa_{1-x}As$ where x=0 to 1 may be used. According to other embodiments further alloyed combinations of (In, Ga, Al) and (As, Sb, P, N) may be used. Further examples include gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe), and also compounds with non-inversion symmetric crystalline unit cells such as molybdenum phosphide (MoP), tantalum arsenide (TaAs), cobalt silicide (CoSi), and the like.

Figure 2E:
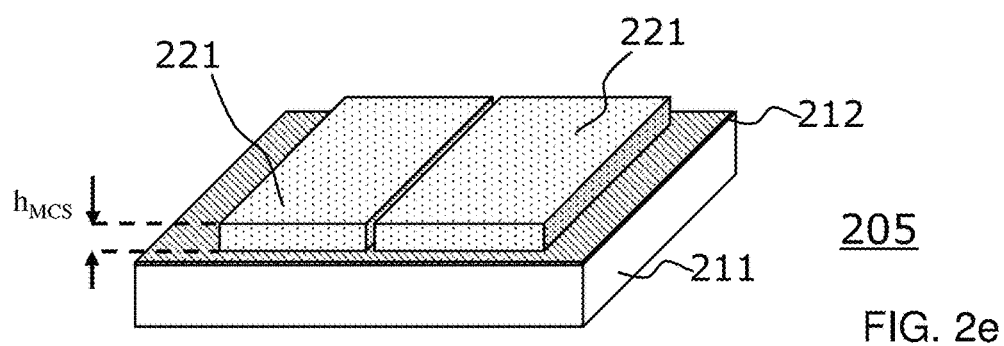
FIG. 2e illustrates a 3-dimensional view of a structure after the template structure and the semiconductor fin structure have been removed.

FIG. 2e illustrates a 3-dimensional view of a structure 205 after the template structure 230 and the semiconductor fin structure 215 have been removed. This may be done, for example, by selective etching techniques.

Figure 2F:
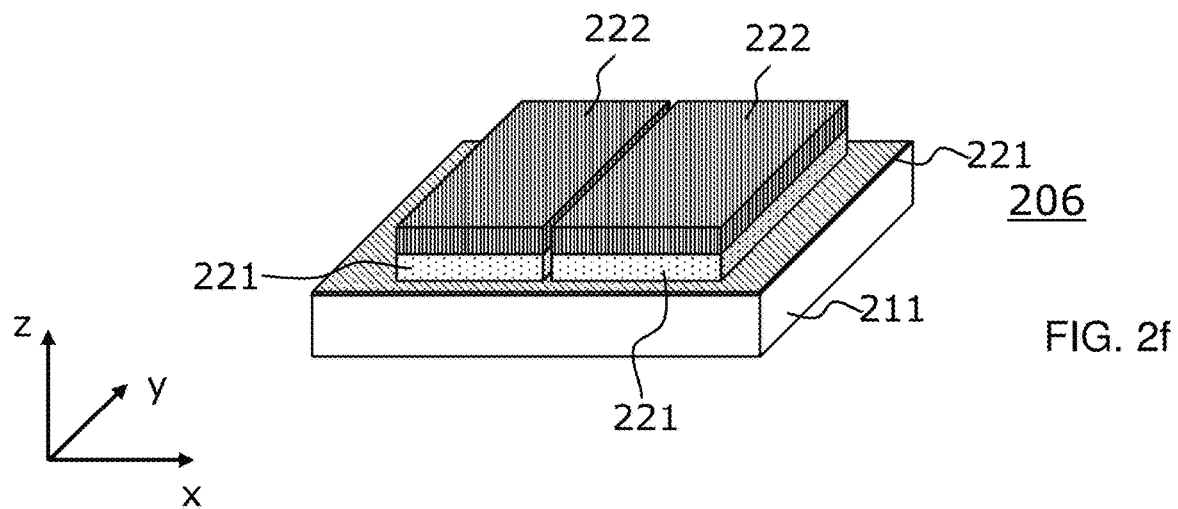
FIG. 2f illustrates a 3-dimensional view of a structure after a further metastable crystalline structure has been formed.

FIG. 2f illustrates a 3-dimensional view of a structure 206 after a further metastable crystalline structure 222 (or planar film, or planar layer) has been formed on the planar film 221. This step may be performed, for example, by a planar epitaxial process.

Figure 3A:
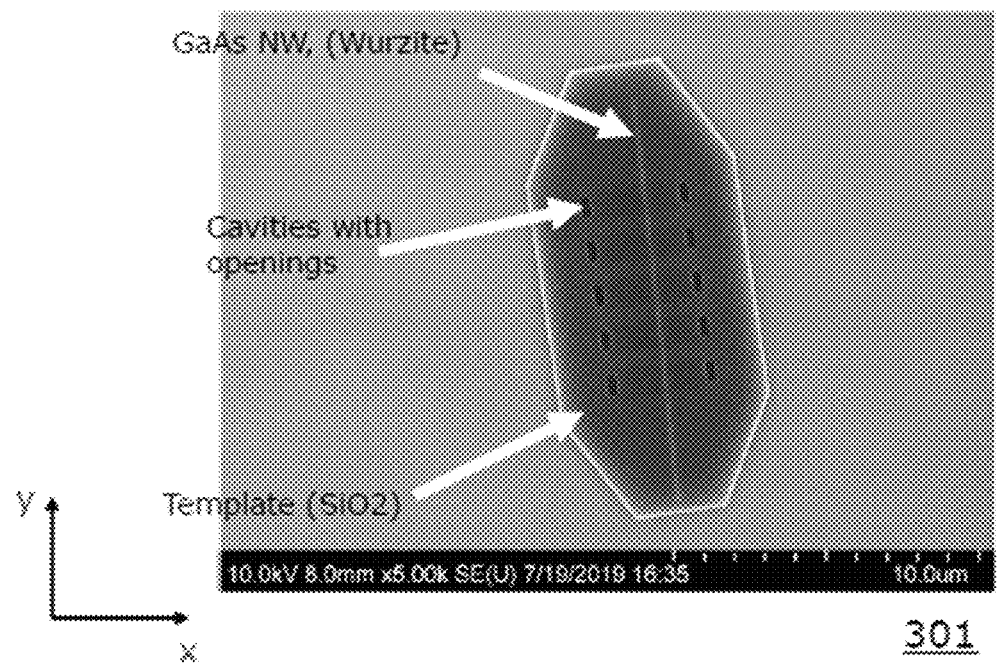
FIG. 3a shows a SEM image of a structure which corresponds to FIG. 2c.
Figure 3B:
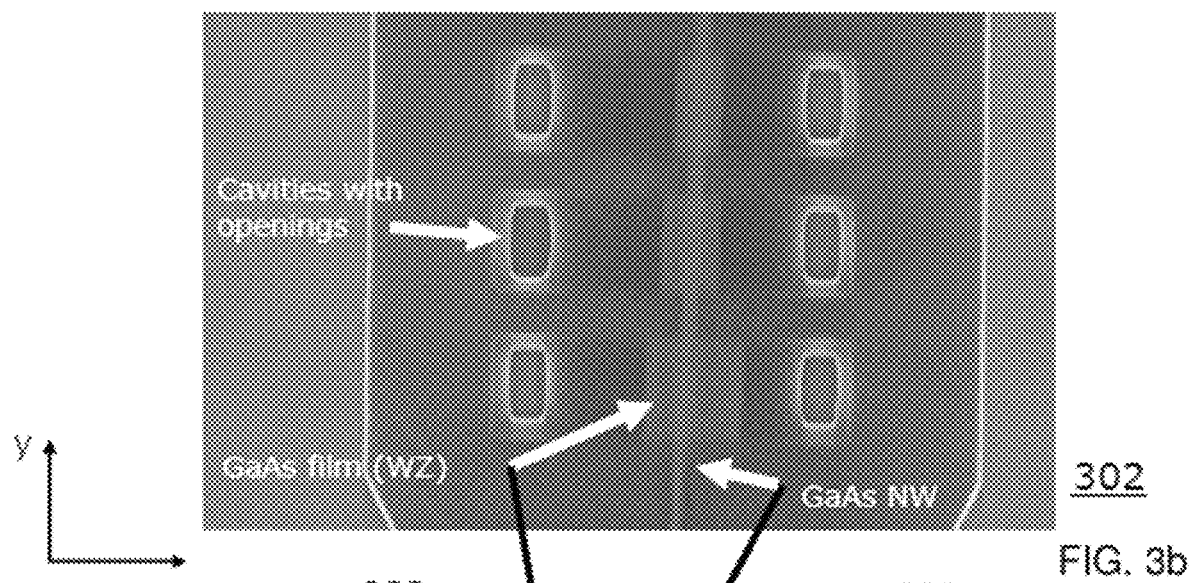
FIG. 3b shows an enlarged SEM image of a structure which corresponds to FIG. 2d.
Figure 3C:
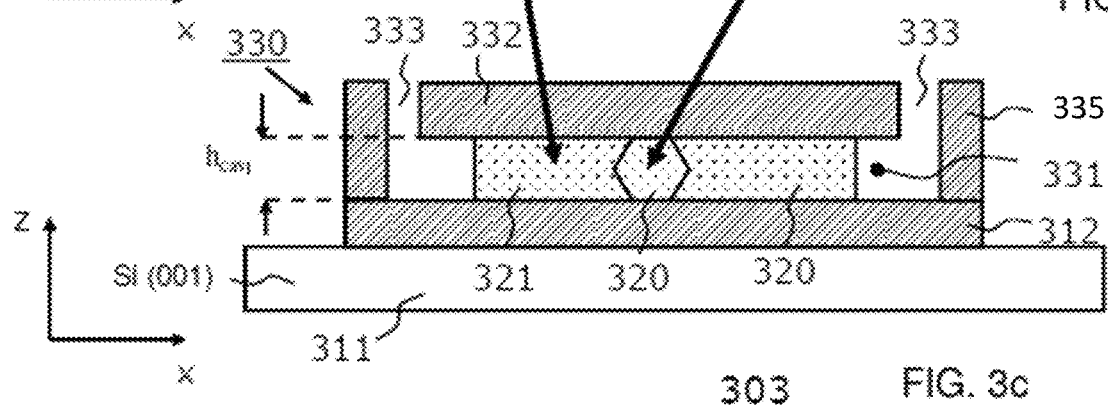
FIG. 3c shows a schematic cross sectional view corresponding to FIG. 3b.

FIG. 3a and FIG. 3b show experimental results of a method according to embodiments of the invention as performed by the applicant. FIG. 3c shows a schematic cross-sectional view corresponding to FIG. 3b.

FIG. 3a shows an SEM image 301 of a structure which corresponds to FIG. 2c. According to the experiment, a metastable seed crystal 320 embodied as GaAs-nanowire in the wurtzite phase has been grown and has been covered in a template structure 330. The template structure 330 has openings 333 to a planar cavity 331.

FIG. 3b shows an enlarged SEM image 302 of a structure which corresponds to FIG. 2d. According to the experiment, a metastable crystalline structure 321 has been grown from the seed crystal 320 by epitaxial growth via the openings 333. The metastable crystalline structure 321 is embodied as GaAs-film in the wurtzite phase FIG. 3c shows a corresponding schematic cross sectional view 303. The cross sectional view 303 also shows a base layer 311 and an insulating layer 312 of an underlying base substrate. The template structure 330 encompasses as walls a horizontal cavity layer 332 and vertical cavity layers 335. The horizontal cavity layer 332 and the vertical cavity layers 335 of the template structure 330 are illustrated in FIG. 3c with a diagonal pattern. The horizontal cavity layer 332 and the insulating layer 312 form the planar cavity 331 with a height $h_{cav}$.

In the following, certain examples of dimensions of the metastable seed crystal 120 and the metastable crystalline structure 121 are explained with reference to FIG. 4a and FIG. 4b.

Figure 4A:
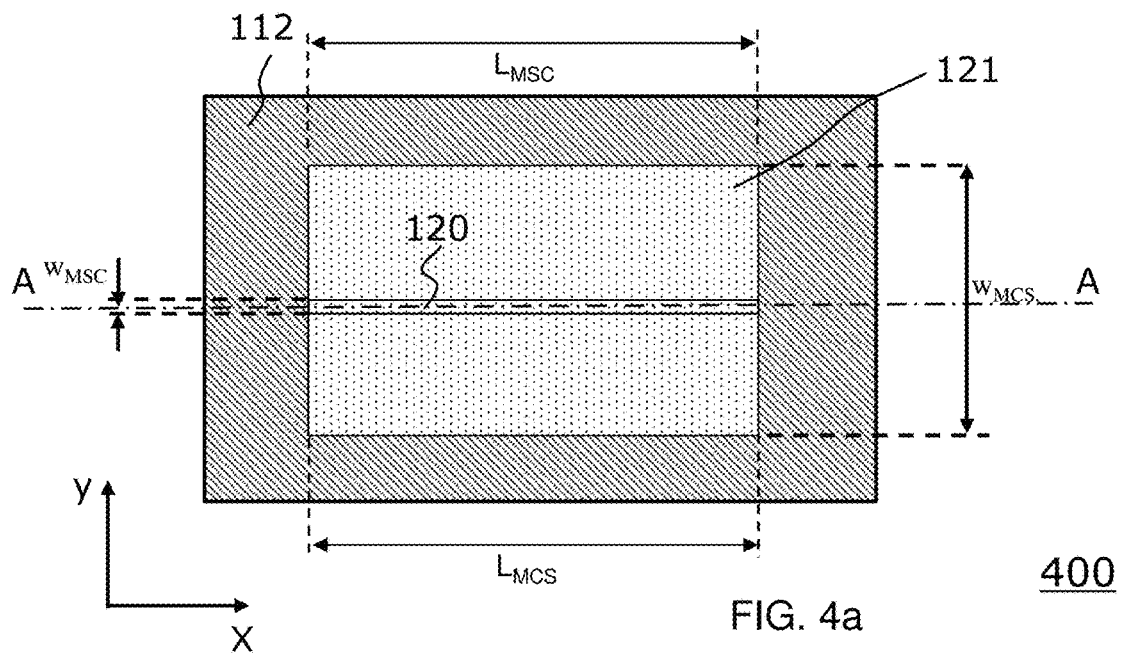
FIG. 4a shows an exemplary top view of the structure of FIG. 1b.
Figure 4B:
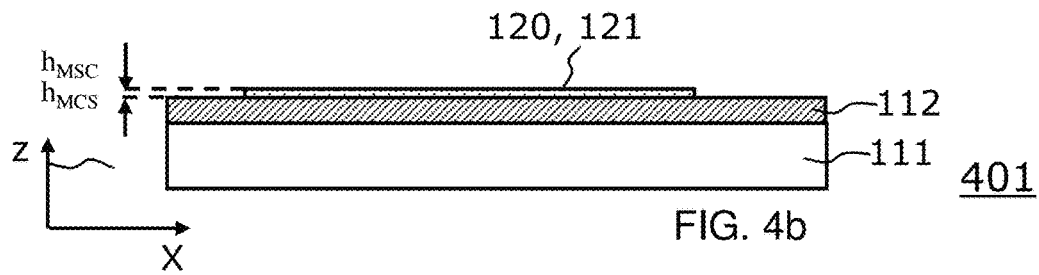

FIG. 4a shows an exemplary top view 400 of the structure 102 as shown in FIG. 1b. FIG. 4b shows an exemplary cross-sectional view 401 taken along the line A-A of FIG. 4a.

The elongated seed crystal 120 has according to embodiments a length $L_{MSC}$ between 5 μm and 1 mm. In certain examples, the width wMSC of the elongated seed crystal 120 is in a range between 20 nm and 200 nm. As mentioned, the elongated seed crystal 120 may be embodied as a nanowire. In the case of a nanowire, the width $w_{MSC}$ corresponds to the diameter of the nanowire.

In certain embodiments, the metastable crystalline structure 121 has a height $h_{MCS}$ of less than 200 nm, in particular less than 100 nm. In certain embodiments, the metastable seed crystal 120 has a height $h_{MCS}$ of less than 200 nm, in particular less than 100 nm.

In certain embodiments, the metastable crystalline structure 121 has a length $L_{MCS}$ between 5 μm and 20 μm corresponding to the length $L_{MSC}$ of the elongated seed crystal 120. Such a length is, in particular, suitable for the controlled growth of nanowires with a predefined crystal phase. in certain embodiments, the width $w_{MCS}$ of the metastable crystalline structure 121 is in a range between 5 µm and 20 µm.

According to embodiments, the elongated metastable seed crystal 120 extends in a first lateral direction of the base substrate 110, in this example in the x-direction. The metastable crystalline structure 121 has been grown in a second lateral direction of the base substrate, in this example in the y-direction. In certain embodiments, the first lateral direction and the second lateral direction are perpendicular to each other.

Figure 5:
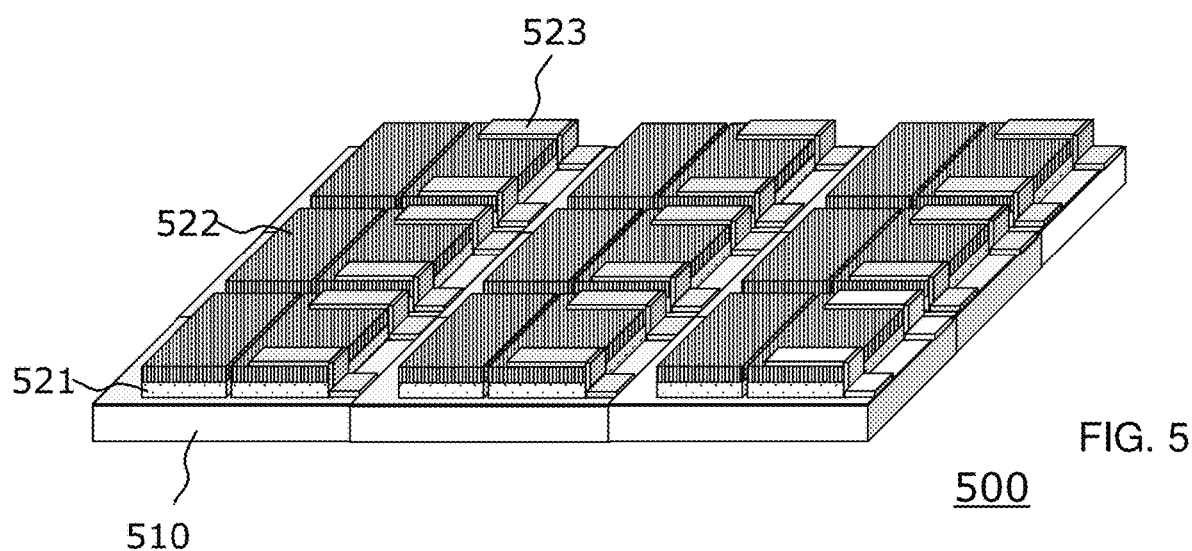
FIG. 5 shows a 3-dimensional view of a wafer comprising a plurality of metastable crystalline structures which have been fabricated according to methods according to the embodiments.

FIG. 5 shows a 3-dimensional view of a wafer 500 comprising a plurality of metastable crystalline structures 521 which have been fabricated as described above by growth from a metastable elongated crystal seed within a template structure. On top of the metastable crystalline structures 521 further metastable crystalline structures 522 have been formed by planar epitaxy. Furthermore, electrical contacts 523 have been formed to contact the metastable crystalline structures 521 and/or the further metastable crystalline structures 522.

The fabrication of such a wafer facilitates an efficient and effective fabrication of electronic devices utilizing the advanced features or characteristics of metastable phases of group III-V, group IV or other materials.

While illustrative examples are given above, it will be appreciated that the basic fabrication steps described above can be used to produce semiconductor structures and substrates of other materials, shapes and sizes. Materials and processing techniques can be selected as appropriate for a given embodiment, and suitable choices will be readily apparent to those skilled in the art.

Methods according to embodiments enable growth in a controlled way metastable crystalline structures, in particular of semiconductor compounds. The methods can be used for a wide range of materials such as SiGe, Ge, GaAs, AlAs, InAs, GaP, AlP, InP, GaSb, InSb and their ternary/quaternary alloy systems. The direct integration of these compounds on industry-standard (001) Si substrates can be used for a wide range of applications, including RF, nanoelectronics and optoelectronic devices.

The disclosed semiconductor structures and substrates may be part of a semiconductor chip. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). The chip may be integrated with other chips, discrete circuit elements, and/or other signal processing devices as part of either an intermediate product, such as a motherboard, or an end product. The end product can be any product that includes integrated circuit chips.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a metastable crystalline structure, the method comprising:
    providing a base substrate including an insulating layer;
    providing a nanowire metastable seed crystal on the base substrate, the nanowire metastable seed crystal having a predefined metastable crystal phase or a predefined metastable composition;
    forming a template structure above the base substrate, the template structure covering at least a part of the nanowire metastable seed crystal; and
    growing, nucleated from the nanowire metastable seed crystal, the metastable crystalline structure which is a 2-dimensional planar film with the predefined metastable crystal phase or the predefined metastable composition of the nanowire metastable seed crystal inside the template structure.

2. The method according to claim 1, wherein the nanowire metastable seed crystal has a length between 5 µm and 1 mm.

3. The method according to claim 1, wherein a width of the nanowire metastable seed crystal is in a range between 20 nm and 200 nm.

4. The method according to claim 1, wherein the template structure comprises a planar cavity, and the method further comprises:
    growing the nanowire metastable crystalline structure in the planar cavity, wherein the planar cavity and the corresponding planar film have a height of less than 20 um.

5. The method according to claim 4, further comprising removing the template structure from the planar film; and forming a further planar film on the planar film by planar epitaxy.

6. The method according to claim 1, wherein the template structure comprises a confinement cavity configured to confine the growing of the nanowire metastable crystalline structure to crystallographic directions that prevent a change of the predefined metastable crystal phase or the predefined metastable composition.

7. The method according to claim 1, wherein the nanowire metastable seed crystal is a semiconductor.

8. The method according to claim 1, wherein the predefined crystal phase is selected from the group consisting of: wurtzite phase; zinc blende phase; and lonsdaleite phase.

9. The method according to claim 1, wherein providing the nanowire metastable seed crystal on the base substrate comprises:
    pre-fabricating the nanowire metastable seed crystal; and
    placing the nanowire metastable seed crystal on the base substrate.

10. The method according to claim 1, wherein providing the nanowire metastable seed crystal on the base substrate comprises:
    growing the nanowire metastable seed crystal directly on the base substrate.

11. The method according to claim 1, wherein the metastable crystalline structure and the nanowire metastable seed crystal are comprised of the same material.

12. The method according to claim 1, wherein the nanowire metastable seed crystal and the metastable crystalline structure comprises a group III-V compound material, a group II-VI compound material or a group IV material.

13. The method according to claim 1, wherein forming the template structure comprises:
    forming a sacrificial structure on the nanowire metastable seed crystal and on the insulating layer;

forming a cavity layer on the sacrificial structure;
forming an opening in the cavity layer, thereby exposing a surface of the sacrificial structure; and
selectively removing the sacrificial structure, thereby exposing the nanowire metastable seed crystal.

14. The method according to claim 1, further comprising:
removing the template structure.

\* \* \* \* \*